(12) United States Patent
Nagatomo

(10) Patent No.: US 8,442,086 B2
(45) Date of Patent: May 14, 2013

(54) PHOTONIC-CRYSTAL SURFACE EMITTING LASER, LASER ARRAY USING THE LASER, AND IMAGE FORMING APPARATUS USING THE LASER ARRAY

(75) Inventor: Yasuhiro Nagatomo, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/230,756

(22) Filed: Sep. 12, 2011

(65) Prior Publication Data

US 2012/0063481 A1    Mar. 15, 2012

(30) Foreign Application Priority Data

Sep. 14, 2010   (WO) .................. PCT/JP2010/065876

(51) Int. Cl.
*H01S 5/00* (2006.01)
(52) U.S. Cl.
USPC .................................. 372/50.124; 372/50.11
(58) Field of Classification Search .............. 372/50.124
See application file for complete search history.

(56) References Cited

U.S. PATENT DOCUMENTS

| | | | |
|---|---|---|---|
| 7,684,460 B2 * | 3/2010 | Hori ................................. | 372/99 |
| 2003/0021322 A1 * | 1/2003 | Steinle et al. .................... | 372/50 |
| 2008/0123709 A1 * | 5/2008 | Hersee ...................... | 372/45.011 |
| 2009/0135876 A1 * | 5/2009 | Takeuchi et al. ........... | 372/50.11 |

FOREIGN PATENT DOCUMENTS

| | | |
|---|---|---|
| JP | 11-135770 A | 5/1999 |
| JP | 11-251631 A | 9/1999 |
| JP | 2000-021789 A | 1/2000 |
| JP | 2000-332351 A | 11/2000 |
| JP | 2009-111360 A | 5/2009 |

* cited by examiner

*Primary Examiner* — Xinning Niu
(74) *Attorney, Agent, or Firm* — Canon U.S.A., Inc. IP Division

(57) ABSTRACT

A laser structure is provided in which an influence caused by a concave-convex structure on laser characteristics is reduced when the Epitaxial Lateral Overgrowth (ELO) technique is applied to a photonic-crystal surface emitting laser. The laser structure includes a first layer, a second layer, a mask structure, a fourth layer, and a photonic crystal. An optical film thickness of the mask structure is not an integer multiple of a half of an oscillation wavelength $\lambda$, and reflectivity taken when laser light enters a multilayer structure including the first layer, the second layer, the mask structure, and the fourth layer from the fourth layer side is lower than reflectivity at an interface between the second layer and the first layer.

11 Claims, 11 Drawing Sheets

PHOTONIC-CRYSTAL SURFACE EMITTING LASER, LASER ARRAY USING THE LASER, AND IMAGE FORMING APPARATUS USING THE LASER ARRAY

TECHNICAL FIELD

Embodiments of the present invention relate to a photonic-crystal surface emitting laser, and more particularly to a photonic-crystal surface emitting laser that utilizes lateral growth for an improvement of crystal quality.

BACKGROUND ART

Recently, many proposals of applying photonic crystals to semiconductor lasers have been reported. Japanese Patent Laid-Open No. 2000-332351 discloses a light source employing a surface emitting laser in which an active layer including a light-emitting material is provided and a two-dimensional photonic crystal is formed in the vicinity of the active layer. The disclosed photonic-crystal surface emitting laser is one type of Distribution Feedback (DFB) laser and has a resonance mode in the in-plane direction of a substrate. In the two-dimensional photonic crystal, columnar holes are periodically formed in a semiconductor layer, and a distribution of its refractive index has two-dimensional periodicity. With the two-dimensional periodicity, part of light generated in the active layer, which has a particular wavelength, resonates to form standing waves, thus causing laser oscillation. Further, the light is taken out in a direction perpendicular to the laser surface with first-order diffraction, and a thus-obtained laser device operates as the surface emitting laser.

Trial products of the photonic-crystal surface emitting laser have been so far fabricated by using various compound semiconductors. Photonic-crystal surface emitting lasers using nitride semiconductors have also been studied.

When trying to reduce the cost of a nitride semiconductor laser, it is advantageous to employ an inexpensive heterogeneous substrate, e.g., a sapphire substrate, instead of an expensive GaN substrate. However, if crystal growth is developed on a heterogeneous substrate as it is, a difficulty arises in obtaining a high-quality crystal less subjected to transitions. In view of such a difficulty, the so-called ELO (Epitaxial Lateral Overgrowth) technique is often utilized for an improvement of crystal quality. With the ELO technique, some concave-convex structure or some mask structure for selective growth is formed on a substrate or in a compound semiconductor layer to develop crystal growth in the lateral direction, thereby obtaining a crystal less subjected to transitions.

Japanese Patent Laid-Open No. 2000-021789 discloses a structure in which the ELO technique is applied to an edge emitting semiconductor laser.

When the ELO technique is applied to the photonic-crystal surface emitting laser, the following problem occurs which is not caused with the edge emitting laser disclosed in the above-cited Patent Literature 2.

FIG. 9 is a schematic view to explain the structure of the edge emitting semiconductor laser disclosed in the above-cited Japanese Patent Laid-Open No. 2000-021789. In FIG. 9, reference numeral 910 denotes a substrate, reference numeral 930 denotes a mask structure for implementation of the ELO technique, and reference numeral 960 denotes an active layer. In the edge emitting semiconductor laser illustrated in FIG. 9, a resonance direction 992 of laser light and emergent light 990 are both restricted in the in-plane direction parallel to the substrate 910, and no light is emitted in a direction toward the substrate. Therefore, optical characteristics of the mask structure 930 used in the ELO technique do not affect characteristics of a laser device.

On the other hand, FIG. 10 is a schematic view to explain a structure in which the ELO technique is applied to the photonic-crystal surface emitting laser. In the photonic-crystal surface emitting laser, a resonance direction 1092 within a photonic crystal 1070 is the in-plane direction of a substrate 1010, while emergent lights 1090 and 1091 are directed perpendicular to the surface of the substrate 1010. The emergent light 1091 directing toward the substrate side reaches the mask structure 1030 that is provided for implementation of the ELO technique, and reflection, diffraction, etc. are generated by a concave-convex structure that is constituted by both the mask structure 1030 and the substrate 1010. Hence, optical characteristics of the mask structure 1030 greatly affect characteristics of a laser device. More specifically, depending on the refractive index of a material forming the mask structure 1030, reflectivity is increased in comparison with the case where the mask structure is not provided. Because reflected light becomes return light or stray light, degradation or instability of the laser characteristics may be caused with the reflected light.

SUMMARY OF INVENTION

According to embodiments of the present invention, there is provided a photonic-crystal surface emitting laser including an active layer and a photonic crystal, which has a resonance mode in an in-plane direction of a substrate, and oscillating at a wavelength $\lambda$, the photonic-crystal surface emitting laser further including a first layer having a first refractive index, a second layer formed on the first layer and having a second refractive index differing from the first refractive index, a mask structure formed on the second layer and having a third refractive index differing from the second refractive index, a fourth layer formed on the second layer and the mask structure and having a fourth refractive index differing from the third refractive index, and the photonic crystal formed on the fourth layer, wherein an optical film thickness of the mask structure is not an integer multiple of a half of the wavelength $\lambda$, and reflectivity taken when laser light enters a multilayer structure including the first layer, the second layer, the mask structure, and the fourth layer from the fourth layer side is lower than reflectivity at an interface between the second layer and the first layer.

Further features of the present invention will become apparent from the following description of exemplary embodiments with reference to the attached drawings.

DESCRIPTION OF EMBODIMENTS

Embodiments of the present invention will be described below.

Figure 1:
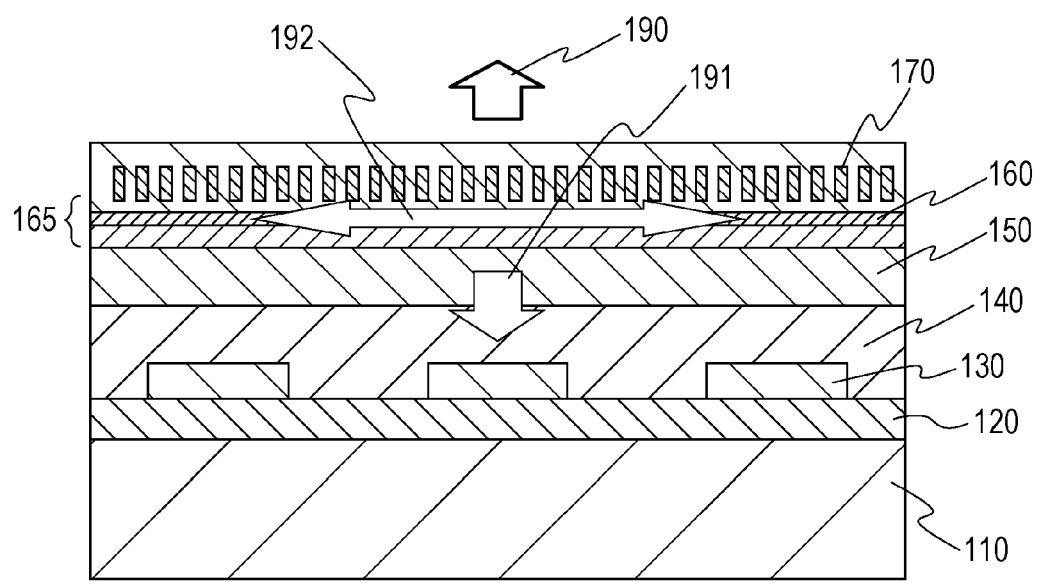
FIG. 1 is a schematic view to explain a photonic-crystal surface emitting laser according to an embodiment of the present invention.

FIG. 1 is a schematic view to explain a photonic-crystal surface emitting laser or laser element to which one embodiment of the present invention is applied. Be it noted that, in this description, the substrate side of a laser device is defined as the lower side, and the side oppositely away from the substrate is defined as the upper side.

Reference numeral 110 denotes a first layer having a first refractive index, i.e., a substrate. Reference numeral 120 denotes a second layer having a second refractive index and disposed on the first layer 110. Reference numeral 130 denotes a mask structure having a third refractive index and employed as a mask for selective growth. In this embodiment, the mask structure is constituted by arraying stripe-shaped members at a pitch in the in-plane direction.

Reference numeral 140 denotes a fourth layer having a fourth refractive index and formed such that the mask structure 130 is embedded in the fourth layer 140 according to the ELO technique.

Reference numeral 150 denotes a clad layer, reference numeral 160 denotes an active layer, reference numeral 165 denotes an optical waveguide layer, and reference numeral 170 denotes a photonic crystal.

Part of light generated in the active layer 160, which has a particular wavelength, couples with a resonance mode resonating in an in-plane direction 192 due to the distribution feedback effect by the photonic crystal 170 and forms standing waves, thus causing laser oscillation. Further, the light is partly taken out in a direction perpendicular to the laser surface with the first-order diffraction effect by the photonic crystal 170, and the laser device operates as a surface emitting laser.

The lattice form of the photonic crystal 170 in the present invention may be a one-dimensional lattice or a two-dimensional lattice insofar as the lattice is able to form standing waves and to cause laser oscillation based on the distribution feedback effect. The one-dimensional lattice may be of a striped structure that is known as the form of a general diffraction grating. The two-dimensional lattice may be provided as, e.g., a square lattice, a triangular lattice, or a graphite lattice. Each lattice point may have a circular, elliptic, triangular, rectangular, or hexagonal shape. The pitch of the lattice is designed to be an integer multiple of an oscillation wavelength $\lambda$ in terms of optical path length.

(Relationship Between Mask Structure and Reflectivity)

In the photonic crystal 170, the first-order diffraction occurs in directions towards not only the upper side, but also the lower side. Therefore, laser light is divided into emergent light 190 directing to the upper side and emergent light 191 directing to the lower side. The emergent light 191 directing to the lower side enters the mask structure 130 from the fourth layer side and causes reflection and diffraction.

An influence of the mask structure 130 upon reflection characteristics will be described with reference to FIG. 2 representing a comparative example.

On condition that a plane wave 291 enters a multilayer structure from above, which is obtained by providing a mask structure 230 on a substrate 210 and embedding the mask structure 230 in a layer 240, reflection spectra are calculated for the case including the mask structure 230 and the case not including the mask structure 230.

It is here premised that the refractive index of the substrate 210 is 1.79, the refractive index of the mask structure 230 is 1.47, and the refractive index of the layer 240 is 2.55.

The mask structure 230 is constituted by periodically arraying stripe-shaped members, each having a width of 3 μm, at a pitch of 6 μm, and the mask structure 230 has a thickness of 816 nm.

Figure 2A:
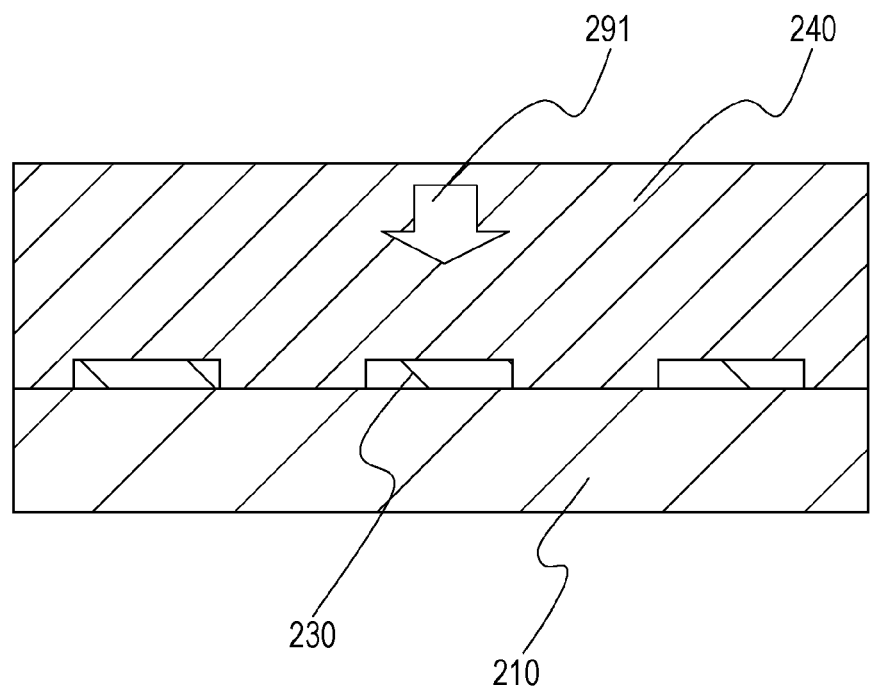
FIG. 2A is a schematic view to explain reflection of light with a mask structure to which the present invention is not applied.
Figure 2B:
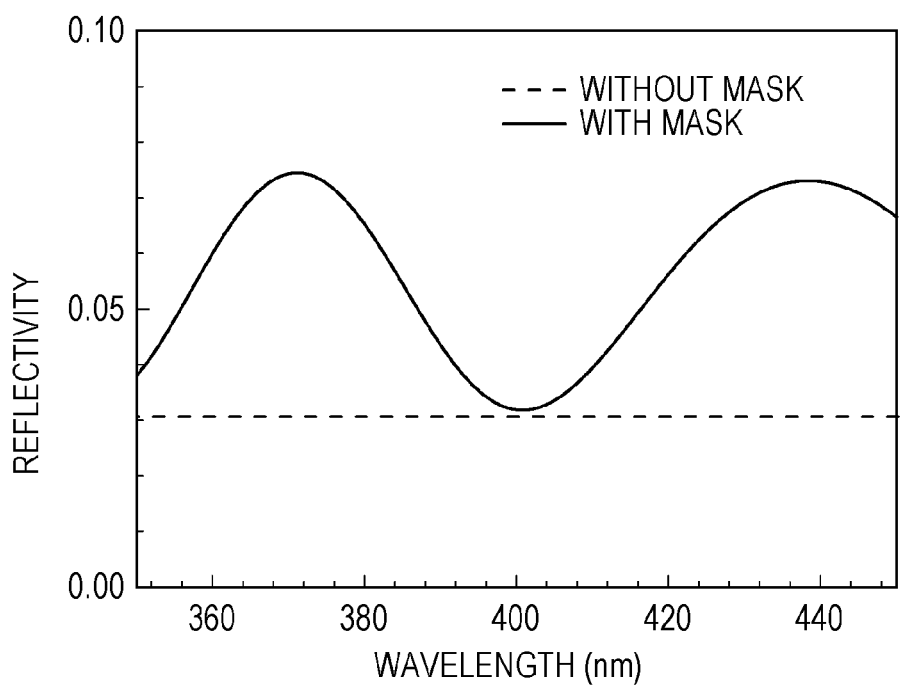
FIG. 2B is a graph to explain the reflection of light with the mask structure to which the present invention is not applied.

In FIG. 2B, a dotted line indicates the calculation result for the case not including the mask structure 230, and a solid line indicates the calculation result for the case including the mask structure 230. In the case not including the mask structure 230, the reflectivity is about 3%. Because refractive index dispersion is not taken into consideration in the calculation, the reflectivity is constant regardless of wavelength.

On the other hand, in the case including the mask structure 230, the reflectivity is increased and decreased depending on wavelength. In this case, even at a wavelength (near 400 nm in the graph) where the reflectivity is most decreased, the minimum reflectivity is slightly larger than that in the case not including the mask structure 230.

Thus, with the provision of the mask structure 230, the reflectivity is increased in comparison with that in the case not including the mask structure 230. As described above, because the reflected light becomes return light or stray light, degradation or instability of the laser characteristics may be caused with the reflected light.

For that reason, it is desired to realize a laser structure including the mask structure capable of reducing the reflected light.

Figure 3A:
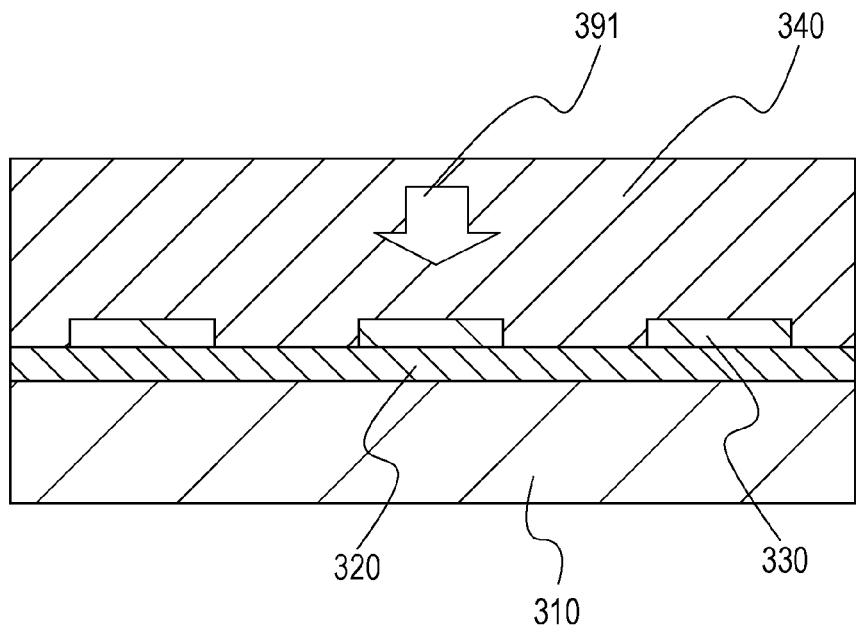
FIG. 3A is a schematic view to explain reflection of light with a mask structure according to the embodiment of the present invention.

FIG. 3A illustrates an exemplary construction in which a layer 320 is provided on a substrate 310, a mask structure 330 is provided on the layer 320, and the mask structure 330 is embedded in a layer 340.

Stated another way, FIG. 2A representing the comparative example and FIG. 3A representing the embodiment apparently differ from in that the latter includes the layer 320. Here, the substrate 210 has a refractive index of 1.79. The layer 320 has a refractive index of 2.55 and a thickness of 157 nm. The mask structure 330 is constituted by periodically arraying stripe-shaped members, each having a width of 3 μm, at a pitch of 6 μm. The mask structure 330 has a refractive index of 1.47 and a thickness of 272 nm. The layer 340 has a refractive index of 2.55 that is equal to the refractive index of the layer 320.

Figure 3B:
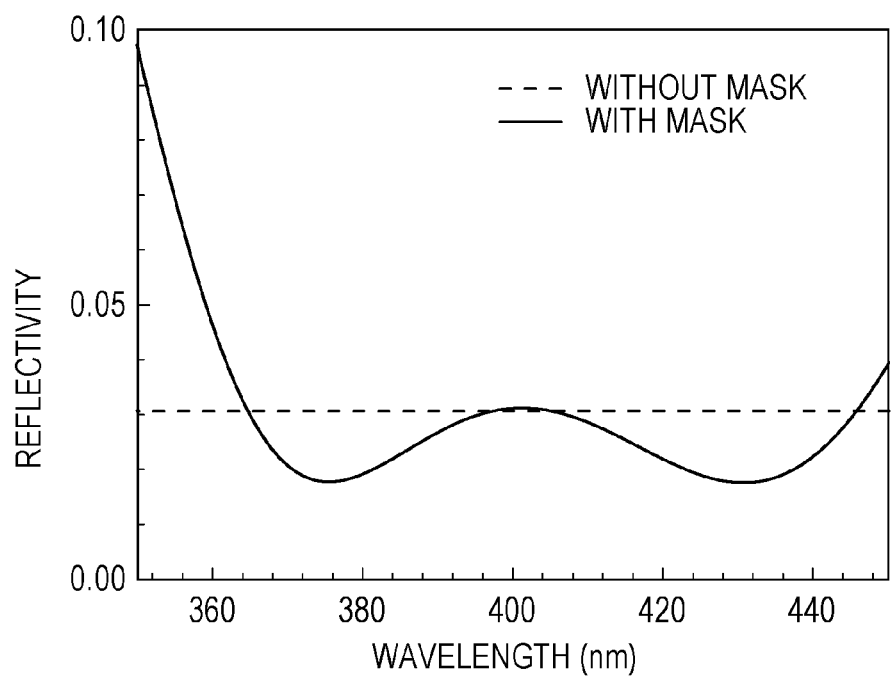
FIG. 3B is a graph to explain the reflection of light with the mask structure according to the embodiment of the present invention.

FIG. 3B plots the result of calculating a reflection spectrum on condition that a plane wave 391 enters the construction, illustrated in FIG. 3A, from above. In FIG. 3B, as in FIG. 2B, a dotted line indicates the calculation result for the case not including the mask structure 330, and a solid line indicates the calculation result for the case including the mask structure 330.

As seen from FIG. 3B, in a particular wavelength range, the construction including the mask structure 330 exhibits a lower reflectivity than the construction not including the mask structure 330. This is a phenomenon that is not observed in the construction of FIG. 2A.

Figure 4:
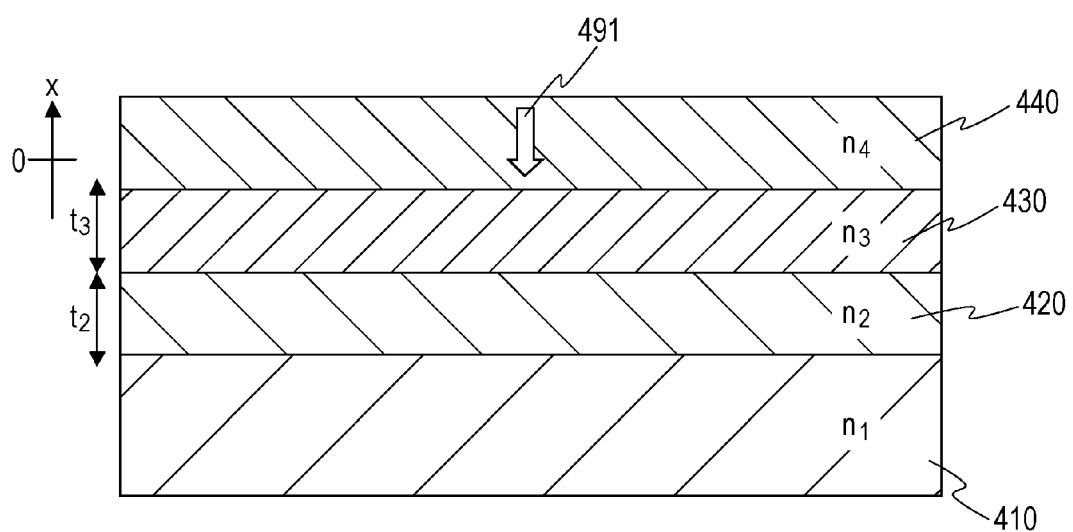
FIG. 4 is a schematic view to explain a reduction of reflectivity with the mask structure according to the embodiment of the present invention.

FIG. 4 is a schematic view to explain the reason why the reflectivity reduces as described above.

It is supposed that a layer 420 having a refractive index of $n_2$, a layer 430 having a refractive index of $n_3$, and a layer 440 having a refractive index of $n_4$ are successively stacked on a layer 410 having a refractive index of $n_1$. A plane wave 491 enters the stacked layers from above. Further, the thickness of the layer 420 is defined as $t_2$, and the thickness of the layer 430 is defined as $t_3$.

The multilayer structure of FIG. 4 is illustrated in the form obtained by generalizing the multilayer structure of FIG. 3A. Thus, the substrate 310 corresponds to the layer 410, the layer 320 corresponds to the layer 420, the mask structure 330 corresponds to the layer 430, and the layer 340 corresponds to the layer 440, respectively.

Reflected light from the entire multilayer structure is provided as a total of lights reflected at respective interfaces. Precise reflectivity can be calculated in consideration of multiple reflections as well. For simplification of a model, however, the mechanism of causing a reduction of the reflectivity is described here based on calculation taking only single reflection into consideration. Be it noted that the calculation results shown in this description are obtained by using characteristic matrices.

In FIG. 4, when $n_2$ and $n_4$ are equal to each other and an optical film thickness ($n_3 \times t_3$) of the layer 430 is an integer multiple of a half wavelength, lights reflected at an upper surface and a lower surface of the layer 430 are completely cancelled out, and the remaining reflected light is only light reflected at the interface between the layer 410 and the layer 420. In other words, that case is equivalent to the case not including the layer 430. This corresponds to the phenomenon that occurs near a wavelength of 400 nm in the graph of FIG. 3B.

On the other hand, when the optical film thickness of the layer 430 is slightly shifted from an integer multiple of the half wavelength, the lights reflected at the upper surface and the lower surface of the layer 430 are not completely cancelled out. When the phase of the not-canceled reflected light and the phase of the light reflected at the upper surface of the layer 410 is shifted from each other by about π, they interfere with each other and are canceled out. As a result, the reflectivity can be reduced to a level lower than that in the case not including the layer 430. This corresponds to the phenomena that occur near a wavelength of 375 nm and near a wavelength of 430 nm in the graph of FIG. 3B.

To express it in formula, when the amplitude of a wave expressed by the following formula 1:

$$\frac{r_{43} \cdot \sin\left(\frac{2\pi}{\lambda} \cdot x \cdot n_4\right) + r_{32} \cdot \sin\left[\frac{2\pi}{\lambda}(x \cdot n_4 + 2 \cdot t_3 \cdot n_3)\right] + r_{21} \cdot \sin\left[\frac{2\pi}{\lambda}(x \cdot n_4 + 2 \cdot t_3 \cdot n_3 + 2 \cdot t_2 \cdot n_2)\right]}{|r_{21}|}$$

is smaller than 1, the reflectivity can be reduced to a level lower than that in the case not including the layer 430.

In the formula 1, λ is an oscillation wavelength. Also, x indicates a coordinate in a direction perpendicular to the substrate surface, and it is defined as positive on the upper side with the interface between the layer 430 and the layer 440 being 0. Further, $r_{43}$ indicates an amplitude reflectivity when light enters from the layer 440 to the layer 430, $r_{32}$ indicates an amplitude reflectivity when light enters from the layer 430 to the layer 420, and $r_{21}$ indicates an amplitude reflectivity when light enters from the layer 420 to the layer 410.

As the premise for causing the above-described phenomena, the refractive indices of the individual layers need to be different from each other in order to generate reflection at the interface between two adjacent layers.

In more detail, it is needed that the first refractive index (i.e., the refractive index of the layer 410) and the second refractive index (i.e., the refractive index of the layer 420) differ from each other, and that the second refractive index and the third refractive index (i.e., the refractive index of the mask structure 430) differ from each other. Further, it is needed that the third refractive index and the fourth refractive index (i.e., the refractive index of the layer 440) differ from each other.

However, other relationships in refractive index between the layers than those described above are optional. For example, the first refractive index and the third refractive index may differ from each other, or they may be the same. Similarly, the second refractive index and the fourth refractive index may differ from each other, or they may be the same.

(Shape, Pitch, Duty Ratio, Etc. Of Mask Structure)

In this embodiment, the shape of the mask structure 130 in the in-plane direction is not limited to particular one. Insofar as there are no problems when the ELO technique is performed, a member having two-dimensionally arrayed openings, for example, may also be used instead of the above-described striped structure members. The striped structure members or the openings may be arranged periodically or aperiodically.

When the mask structure is a periodic structure, the pitch of the periodic structure is preferably not smaller than a certain value. The influence of the pitch of the mask structure upon a reflection spectrum will be described with reference to FIG. 5. FIGS. 5A to 5D plot the calculation results when the pitch of the mask structure in the construction, illustrated in FIG. 3A, is changed to 1 μm, 2 μm, 4 μm, and 6 μm, respectively. The calculation is made on condition that the quotient of the width of the mask structure 130 by the pitch of the mask structure 130 is defined as a duty ratio, and that the duty ratio is fixedly set to 50%.

Figure 5A:
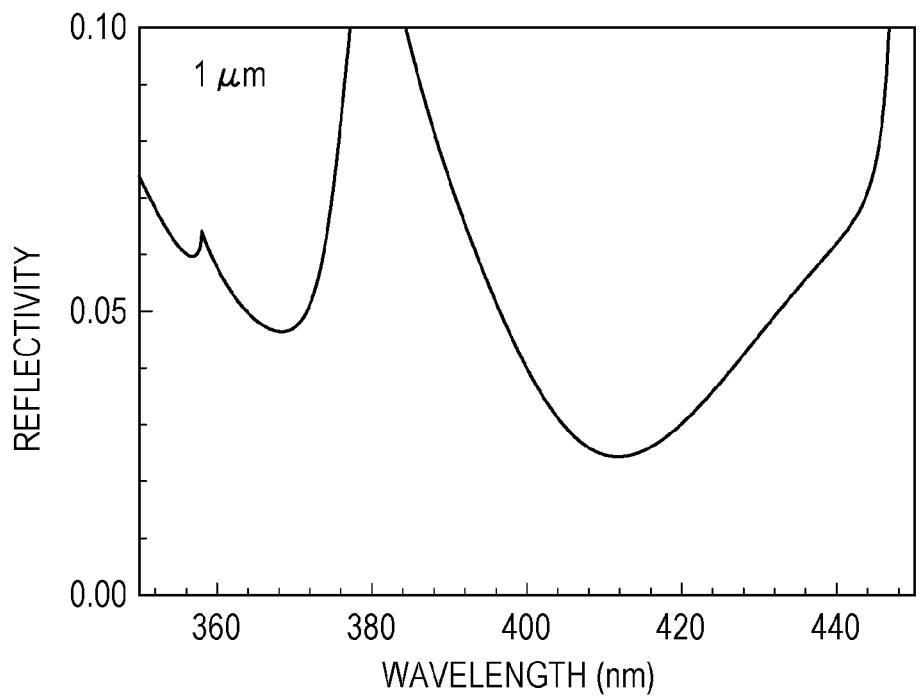
FIG. 5A is a graph to explain pitch dependency of reflectivity with the mask structure according to the embodiment of the present invention.
Figure 5B:
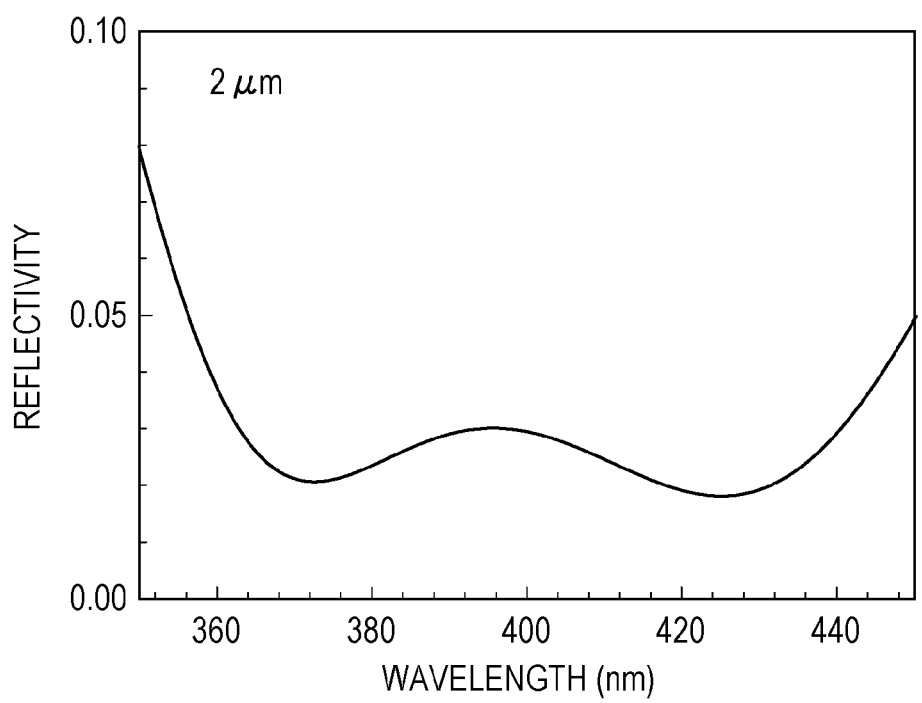
FIG. 5B is a graph to explain the pitch dependency of reflectivity with the mask structure according to the embodiment of the present invention.
Figure 5C:
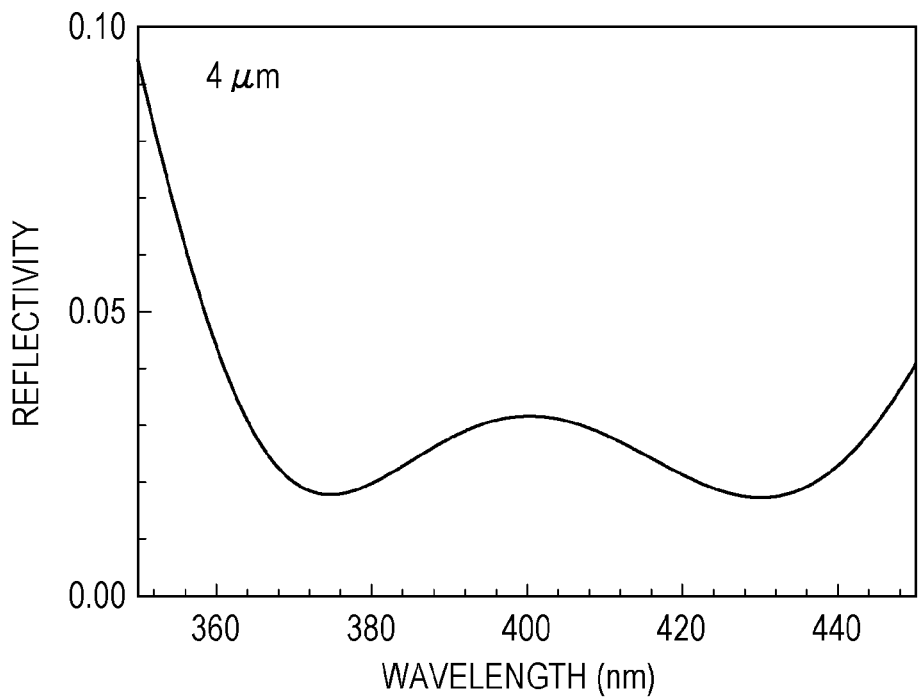
FIG. 5C is a graph to explain the pitch dependency of reflectivity with the mask structure according to the embodiment of the present invention.
Figure 5D:
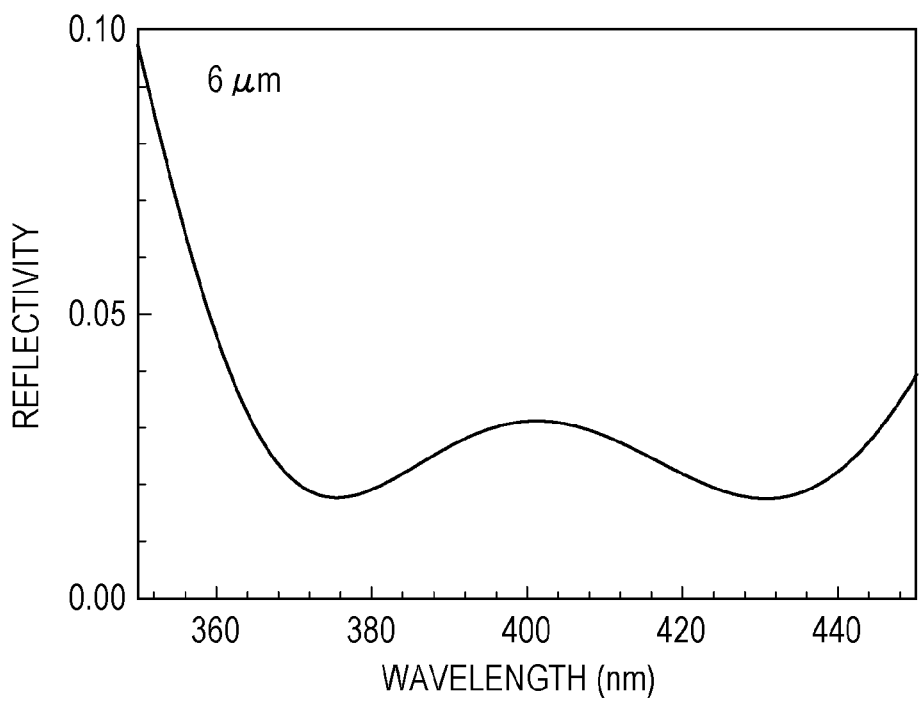
FIG. 5D is a graph to explain the pitch dependency of reflectivity with the mask structure according to the embodiment of the present invention.

When the pitch is relatively large as in FIGS. 5B to 5D, change of the spectrum shape depending on change of the pitch is hardly apparent. However, when the pitch is smaller than the certain value as in FIG. 5A, the spectrum behaves in a complex way, for example, such that the magnitude of the reflected light is abruptly increased at a particular wavelength. It is hence difficult to control the spectrum. In general, polarization dependency of the reflectivity of the periodic structure is hardly apparent when the pitch is relatively large. The polarization dependency is increased as the pitch decreases. From the viewpoint of device design that is simple and is robust against errors in fabrication, therefore, it is desirable that the pitch of the periodic mask structure is set to be sufficiently large. In practice, the pitch is desirably set larger than the oscillation wavelength substantially by an order of magnitude.

Figure 6A:
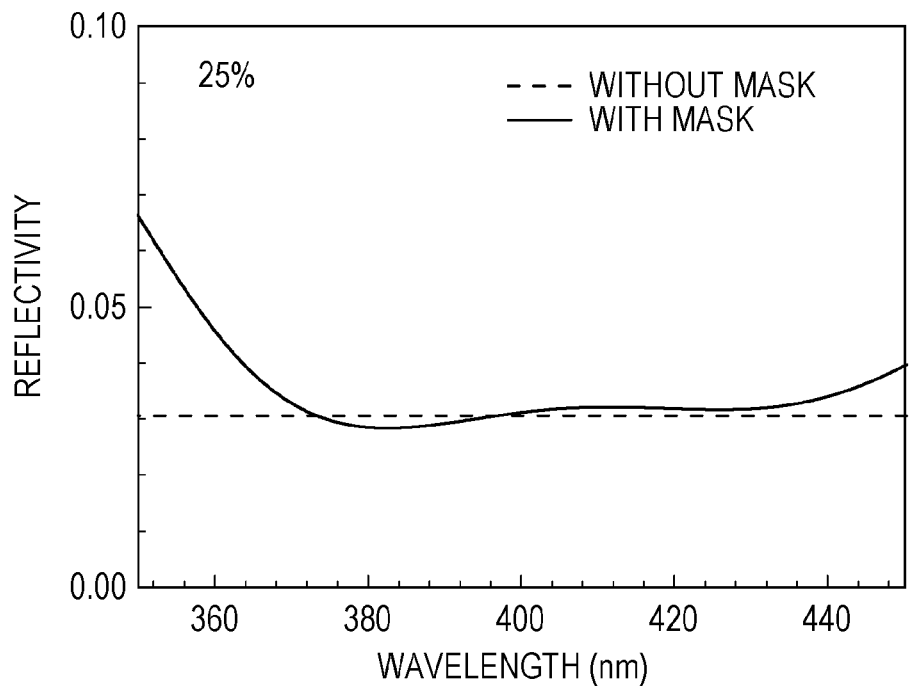
FIG. 6A is a graph to explain duty-ratio dependency of reflectivity with the mask structure according to the embodiment of the present invention.
Figure 6B:
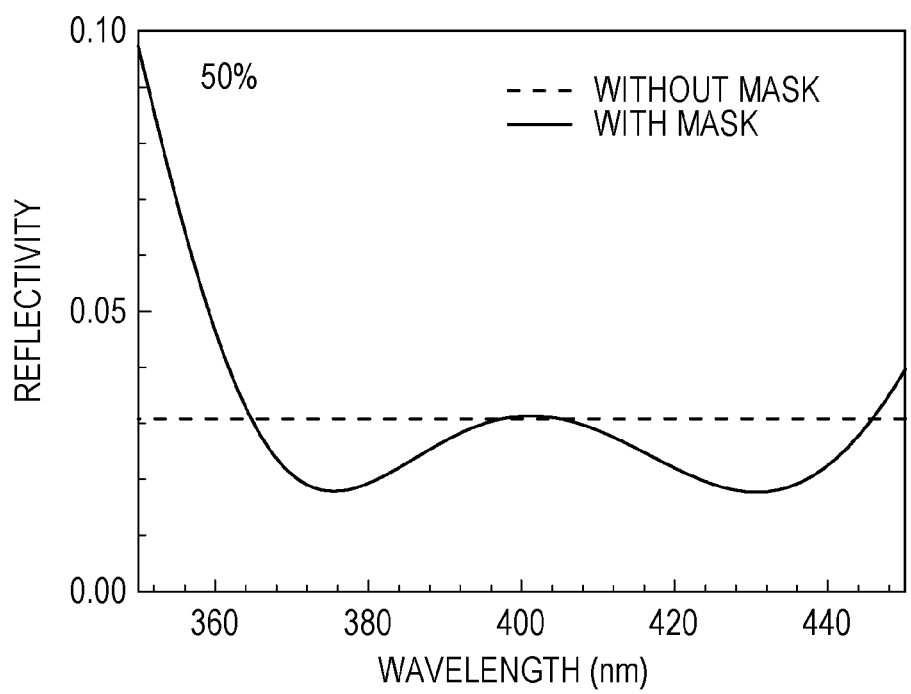
FIG. 6B is a graph to explain the duty-ratio dependency of reflectivity with the mask structure according to the embodiment of the present invention.
Figure 6C:
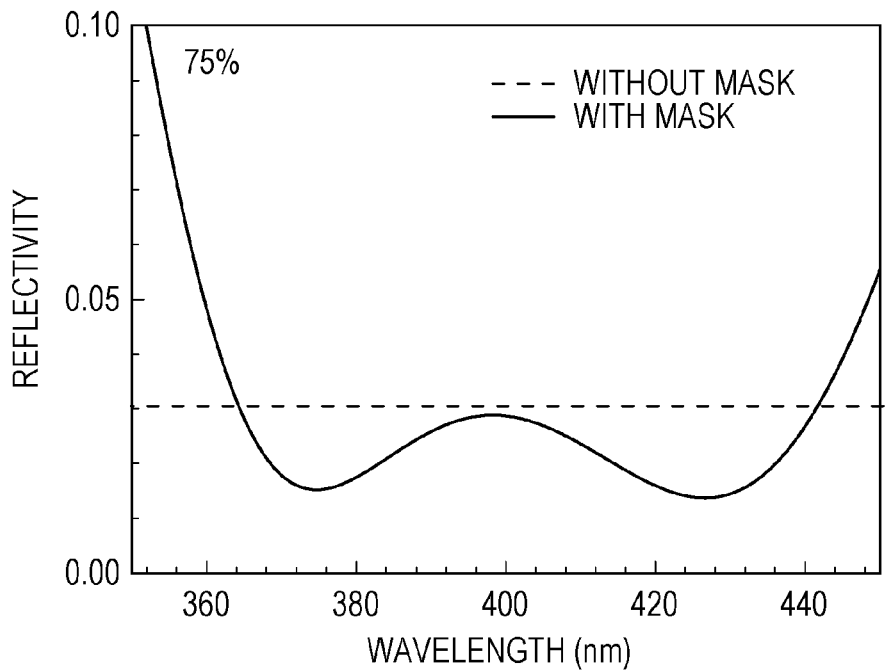
FIG. 6C is a graph to explain the duty-ratio dependency of reflectivity with the mask structure according to the embodiment of the present invention.
Figure 6D:
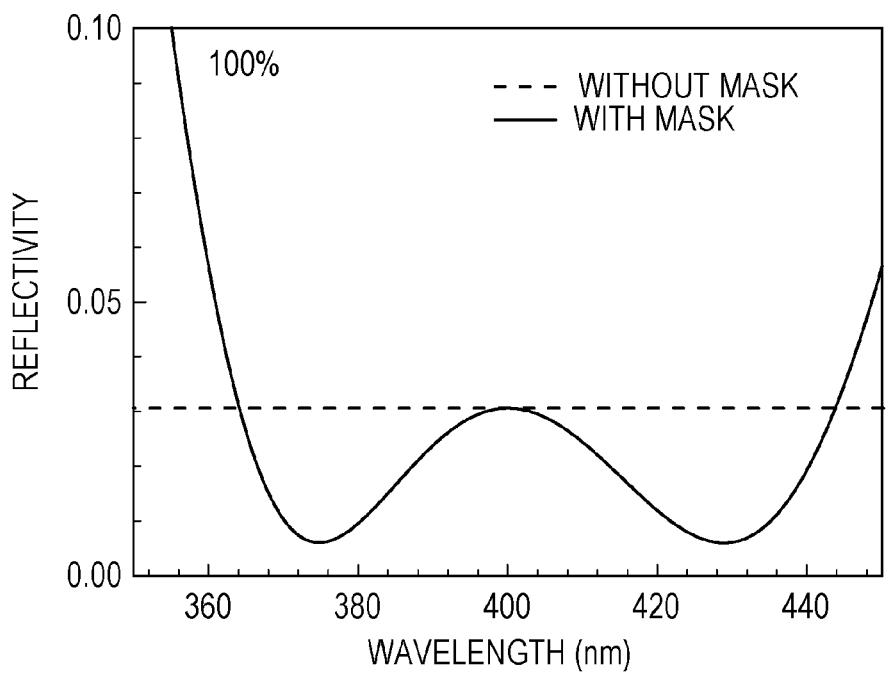
FIG. 6D is a graph to explain the duty-ratio dependency of reflectivity with the mask structure according to the embodiment of the present invention.

The duty ratio of the mask structure may affect the optical characteristics. FIG. 6 plots the result of calculating the duty-ratio dependency while the pitch of the mask structure is fixedly set to 6 μm. FIG. 6A plots the calculation result when the duty ratio of the mask structure is 25%, and FIG. 6B plots the calculation result when it is 50%. FIG. 6C plots the calculation result when the duty ratio of the mask structure is 75%, and FIG. 6D plots the calculation result when it is 100%. The other structural conditions than the duty ratio are the same as those illustrated in FIG. 3A. For reference, a dotted line in each graph indicates a reflection spectrum when the mask structure is not provided (i.e., when the duty ratio is 0%). As seen from comparison among those reflection spectra, as the duty ratio increases, the difference with respect to the case not including the mask structure is increased and the reflectivity reduction effect is also increased. From the viewpoint of achieving the object of the present invention, the duty ratio of the mask structure is desirably as large as possible.

On the other hand, if the duty ratio of the mask structure is too large, a difficulty may arise in properly embedding the mask structure during the crystal growth according to the ELO technique. As an extreme example, if the duty ratio is 100%, this implies that the entire surface of the semiconductor layer is covered the mask structure, and hence the ELO technique cannot be performed in practice. From the viewpoint of performing the ELO technique, therefore, the mask structure is required to have openings that are one-dimensionally or two-dimensionally arrayed. Thus, the duty ratio needs to be set depending on conditions for the crystal growth within a range not impeding the implementation of the ELO technique.

In consideration of the reflectivity reduction effect and the crystal growth, therefore, the duty ratio is preferably from 30% to 90%. More preferably, the duty ratio is from 40% to 75%.

While the ELO technique can be used without being limited to particular materials, it is practically applied to nitride semiconductors in many cases. The reason is that, at the present time, because a GaN substrate is generally very expensive, a percentage of using a heterogeneous substrate is larger than that in the case utilizing other compound semiconductors. When the ELO technique is performed on the nitride semiconductors, the substrate is provided as, e.g., a sapphire substrate, a Si substrate, or a SiC substrate.

Other Embodiments

According to this embodiment, the first layer is not always required to be a substrate. The multilayer structure may be prepared by forming on the substrate, as the first layer, the same or a different material as or from the material of the substrate, and successively forming the second layer, the mask structure, and the fourth layer on the first layer. In an example of the modified multilayer structure, an AlGaN layer is grown on a GaN substrate, and a GaN layer is grown on the AlGaN layer. Further, the mask structure is formed by forming a film of $SiO_2$ on the surface of the GaN layer and patterning it into a concave-convex shape. Thereafter, the mask structure is embedded with GaN by employing the ELO technique.

Alternatively, after fabricating a laser structure on a substrate by applying the present invention, the laser structure including a mask structure may be peeled off from the substrate and attached to another substrate. As one that type of structure, for example, after forming a nitride semiconductor laser structure on a sapphire substrate by applying one embodiment of the present invention, the sapphire substrate may be peeled off by laser liftoff, and the nitride semiconductor laser structure may be attached to a silicon substrate.

Also, the active layer in the embodiment can be provided as an active layer that is used in a general semiconductor laser. The active layer is of, for example, a multiquantum well structure employing GaAs/AlGaAs, GaInP/AlGaInP, GaN/InGaN, or other suitable materials.

Further, the surface emitting laser according to the embodiment can be operated at an arbitrary wavelength.

The surface emitting laser according to the embodiment can be driven with an optical pumping method or an electric current injection method.

The surface emitting laser according to the embodiment may be arrayed in plural on the same plane and used as a light source in the form of an array.

The surface emitting laser according to the embodiment can also be utilized as a light source for drawing an image on a photosensitive drum in a copying machine or an image forming apparatus, such as a laser printer.

EXAMPLES

EXAMPLES of embodiments of the present invention will be described below.

Example 1

A photonic-crystal surface emitting laser according to EXAMPLE 1 is described with reference to FIG. 7.

Figure 7A:
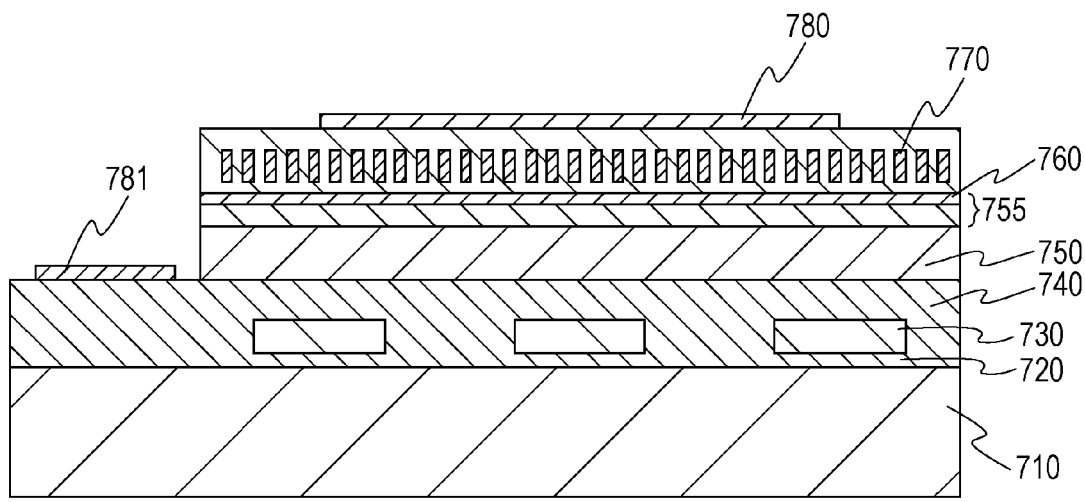
FIG. 7A is a schematic view to explain a photonic-crystal surface emitting laser according to EXAMPLE 1 of the present invention.

FIG. 7A is a schematic view to explain a laser structure of this EXAMPLE. A GaN layer 720 having a thickness of 470 nm is formed on a sapphire substrate 710. As a mask structure, stripe-shaped members (mask structure 730) made of $SiO_2$ and having a width of 3 μm and a height of 816 nm are periodically arrayed at a pitch of 6 μm on the GaN layer 720. A GaN layer 740 is epitaxially grown by employing the ELO technique such that the $SiO_2$ stripe-shaped members are embedded in the GaN layer 740. An $Al_{0.2}Ga_{0.9}N$ clad layer 750, an optical waveguide layer 755, an active layer 760, and a two-dimensional photonic crystal 770 are successively formed on the GaN layer 740. The two-dimensional photonic crystal 770 includes two-dimensionally arrayed columnar holes formed therein. The lattice form is a square lattice, and the lattice constant is 163 nm. The holes have a circular shape and a diameter of 60 nm.

The active layer 760 is of an $In_{0.09}Ga_{0.91}N/In_{0.02}Ga_{0.98}N$ multiquantum well structure in three periods.

A p-electrode 780 and an n-electrode 781 are disposed on the surface of the laser structure. Laser oscillation is caused by injecting an electric current through those electrodes.

The laser structure of this EXAMPLE is designed to cause the laser oscillation at a wavelength of 410 nm.

Figure 7B:
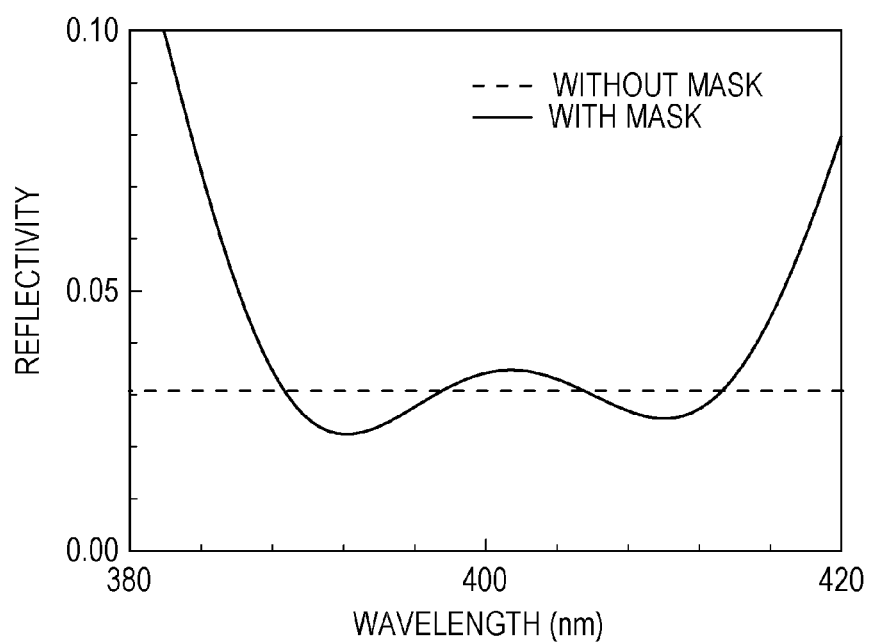
FIG. 7B is a graph to explain the photonic-crystal surface emitting laser according to EXAMPLE 1 of the present invention.

FIG. 7B plots the result of calculating the reflectivity when a plane wave enters the mask structure 730 in the laser structure of this EXAMPLE from above. Dips of the reflectivity are confirmed near a wavelength of 392 nm and near a wavelength of 410 nm.

Part of light generated with the laser oscillation in the two-dimensional photonic crystal 770 is output downwards due to first-order diffraction and reaches the mask structure 730. Here, since the wavelength of the laser oscillation and the wavelength at the reflectivity dip in FIG. 7B are aligned with each other, undesired reflected light from the mask structure can be reduced.

Example 2

An image forming apparatus using a light source in the form of a photonic-crystal surface emitting laser array, which is constituted by arraying the above-described photonic-crystal surface emitting laser in plural, will be described below with reference to FIG. 8. In other words, the photonic-crystal surface emitting laser array includes a plurality of photonic-crystal surface emitting laser elements wherein each of the photonic-crystal surface emitting laser elements is described above.

Figure 8A:
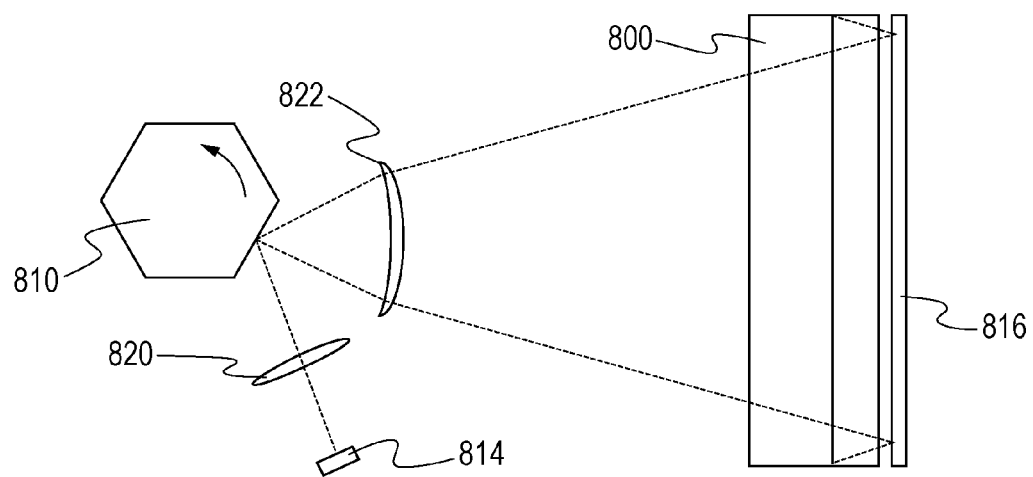
FIG. 8A is a schematic view to explain an image forming apparatus according to EXAMPLE 2 of the present invention.
Figure 8B:
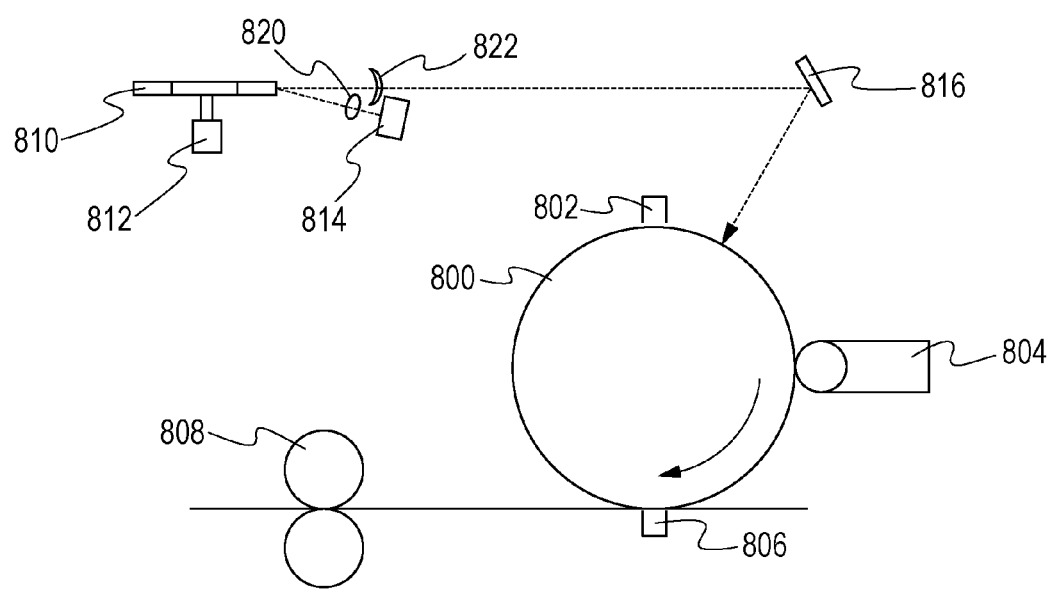
FIG. 8B is a schematic view to explain the image forming apparatus according to EXAMPLE 2 of the present invention.
Figure 9:
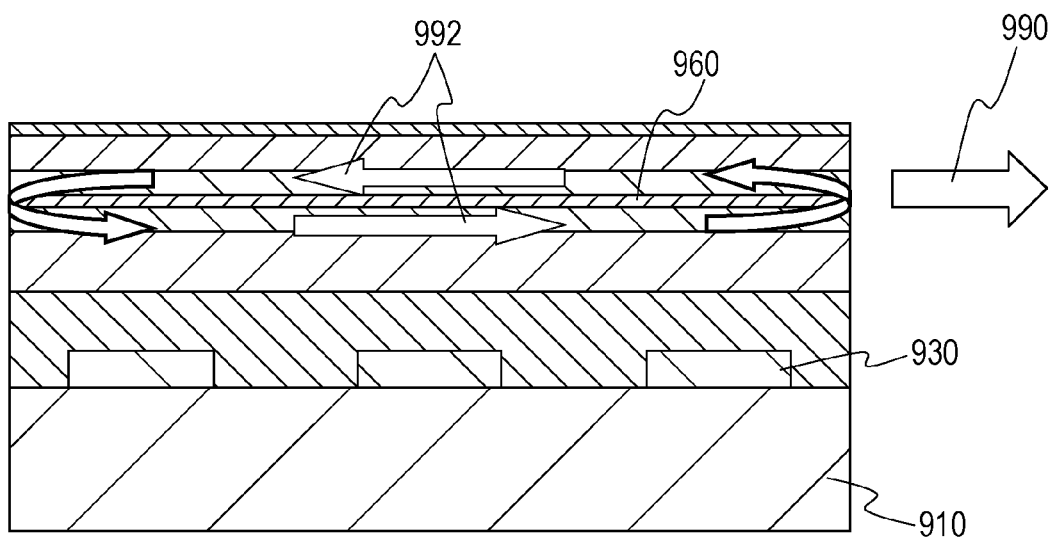
FIG. 9 is a schematic view to explain a light propagating direction in an edge emitting semiconductor laser.
Figure 10:
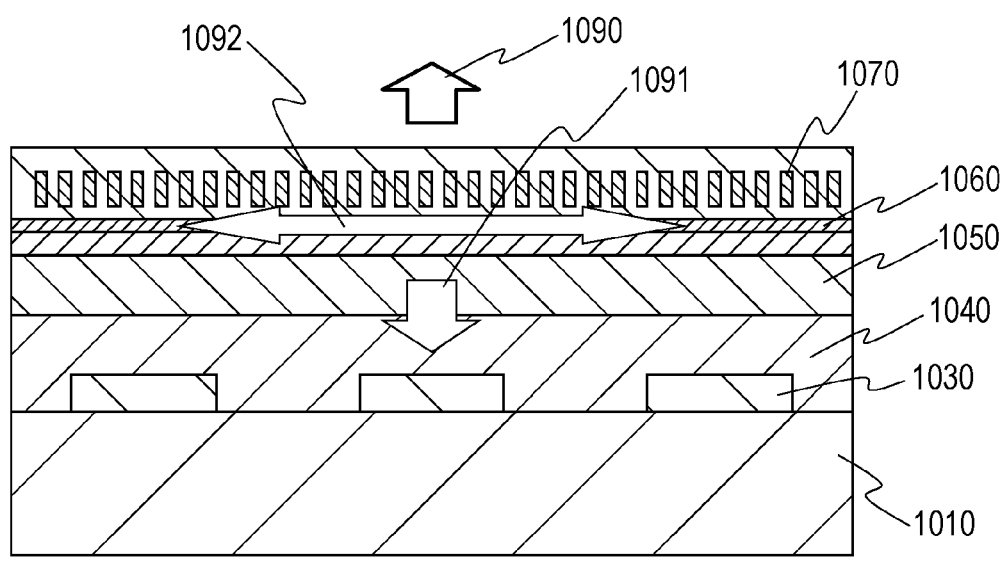
FIG. 10 is a schematic view to explain light propagating directions in a surface emitting semiconductor laser using a photonic crystal.

FIG. 8A is a plan view of the image forming apparatus, and FIG. 8B is a side view of the image forming apparatus.

In FIG. 8, reference numeral 800 denotes a photosensitive drum (photosensitive member), reference numeral 802 denotes a charger, reference numeral 804 denotes a developing device, reference numeral 806 denotes a transfer charger, reference numeral 808 denotes a fusing device, reference numeral 810 denotes a rotatable polygon mirror, and reference numeral 812 denotes a motor. Further, reference numeral 814 denotes a light source in the form of a surface emitting laser array, reference numeral 816 denotes a reflecting mirror, reference numeral 820 denotes a collimator lens, and reference numeral 822 denotes an f–θ lens.

In FIG. 8A, the motor 812 rotationally drives the rotatable polygon mirror 810.

The surface emitting laser array 814 serves as a light source for recording, which is turned on or off by a driver in accordance with an image signal. Laser light thus optically modulated is emitted from the surface emitting laser array 814 to the rotatable polygon mirror 810 through a collimator lens 820.

The rotatable polygon mirror 810 is rotated in a direction denoted by an arrow. With the rotation of the rotatable polygon mirror 810, the laser light output from the surface emitting laser array 814 is reflected by a reflecting surface of the rotatable polygon mirror 810 as a deflection beam of which emergence angle is continuously changed. The reflected light is subjected to, e.g., correction of distortion aberration through the f–θ lens 822 and is directed to the photosensitive drum 800 through the reflecting mirror 816 to be scanned over the photosensitive drum 800 in the main scanning direction.

The photosensitive drum 800 is previously charged by the charger 802 and is successively exposed with scanning of the laser light, whereby an electrostatic latent image is formed. With the photosensitive drum 800 rotated in a direction denoted by an arrow, the formed electrostatic latent image is developed into a visible image by the developing device 804, and the developed visible image is transferred to a sheet of transfer paper by the transfer charger 806. The sheet of transfer paper including the visible image transferred thereto is conveyed to the fusing device 808. After the visible image has been fused and fixed, the sheet of transfer paper is discharged to the outside of the image forming apparatus.

With embodiments of the present invention, the laser structure capable of reducing the influence caused by the concave-convex structure on the laser characteristics can be obtained when the ELO technique is applied to the photonic-crystal surface emitting laser.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of International Patent Application No. PCT/JP2010/065876 filed Sep. 14, 2010, which is hereby incorporated by reference herein in its entirety.

The invention claimed is:

1. A photonic-crystal surface emitting laser including an active layer and a photonic crystal, which has a resonance mode in an in-plane direction of a substrate, and oscillating at a wavelength λ, the photonic-crystal surface emitting laser comprising:
a first layer having a first refractive index;
a second layer formed on the first layer and having a second refractive index differing from the first refractive index;
a mask structure formed on the second layer and having a third refractive index differing from the second refractive index, the mask structure being arraying members;
a fourth layer formed on the second layer and the mask structure and having a fourth refractive index differing from the third refractive index; and
the photonic crystal formed on the fourth layer, wherein an optical film thickness of the mask structure is not an integer multiple of a half of the wavelength λ, and
reflectivity taken when laser light enters a multilayer structure including the first layer, the second layer, the mask structure, and the fourth layer from the fourth layer side is lower than reflectivity at an interface between the second layer and the first layer.

2. The photonic-crystal surface emitting laser according to claim 1, wherein the multilayer structure is constituted such that an amplitude of a wave expressed by a following formula is smaller than 1:

$$\frac{r_{43} \cdot \sin\left(\frac{2\pi}{\lambda} \cdot x \cdot n_4\right) + r_{32} \cdot \sin\left[\frac{2\pi}{\lambda}(x \cdot n_4 + 2 \cdot t_3 \cdot n_3)\right] + r_{21} \cdot \sin\left[\frac{2\pi}{\lambda}(x \cdot n_4 + 2 \cdot t_3 \cdot n_3 + 2 \cdot t_2 \cdot n_2)\right]}{|r_{21}|}$$

λ: oscillation wavelength
$t_2$: thickness of the second layer
$t_3$: thickness of the mask structure
$n_2$: second refractive index
$n_3$: third refractive index
$n_4$: fourth refractive index
$r_{43}$: amplitude reflectivity at an interface between the fourth layer and the mask structure
$r_{32}$: amplitude reflectivity at an interface between the mask structure and the second layer $r_{21}$: amplitude reflectivity at the interface between the second layer and the first layer x: coordinate in a direction perpendicular to a substrate surface.

3. The photonic-crystal surface emitting laser according to claim 1, wherein the second layer and the fourth layer are epitaxially grown.

4. The photonic-crystal surface emitting laser according to claim 1, wherein the second layer and the fourth layer are made of a same material.

5. The photonic-crystal surface emitting laser according to claim 1, wherein the mask structure is formed by an array of a plurality of members having the third refractive index.

6. The photonic-crystal surface emitting laser according to claim 1, wherein the mask structure is formed by a member having a plurality of openings and having the third refractive index.

7. The photonic-crystal surface emitting laser according to claim 1, wherein the first layer is the substrate.

8. The photonic-crystal surface emitting laser according to claim 1, wherein the first layer is a sapphire substrate, a SiC substrate, or a Si substrate, and the second layer and the fourth layer are made of GaN.

9. The photonic-crystal surface emitting laser according to claim 1, wherein a material having the third refractive index is $SiO_2$.

10. A photonic-crystal surface emitting laser array including a plurality of the photonic-crystal surface emitting laser elements, each of the photonic-crystal surface emitting laser elements including an active layer and a photonic crystal, which has a resonance mode in an in-plane direction of a substrate, and oscillating at a wavelength λ, the each of the photonic-crystal surface emitting laser elements comprising:
a first layer having a first refractive index;
a second layer formed on the first layer and having a second refractive index differing from the first refractive index;
a mask structure formed on the second layer and having a third refractive index differing from the second refractive index, the mask structure being arraying members;
a fourth layer formed on the second layer and the mask structure and having a fourth refractive index differing from the third refractive index; and
the photonic crystal formed on the fourth layer,
wherein an optical film thickness of the mask structure is not an integer multiple of a half of the wavelength λ, and
reflectivity taken when laser light enters a multilayer structure including the first layer, the second layer, the mask structure, and the fourth layer from the fourth layer side is lower than reflectivity at an interface between the second layer and the first layer.

11. An image forming apparatus comprising the photonic-crystal surface emitting laser array according to claim 10, and a photosensitive member irradiated with laser light from the photonic-crystal surface emitting laser array.

* * * * *